(12) United States Patent
Lee et al.

(10) Patent No.: US 9,520,211 B2
(45) Date of Patent: Dec. 13, 2016

(54) METHOD OF FORMING UPPER ELECTRODE OF NANOWIRE ARRAY

(71) Applicant: KOREA RESEARCH INSTITUTE OF STANDARDS AND SCIENCE, Daejeon (KR)

(72) Inventors: Woo Lee, Daejeon (KR); Hee Han, Daejeon (KR)

(73) Assignee: KOREA RESEARCH INSTITUTE OF STANDARDS AND SCIENCE (KR)

(*) Notice: Subject to any disclaimer, the term of this patent is extended or adjusted under 35 U.S.C. 154(b) by 207 days.

(21) Appl. No.: 14/386,863

(22) PCT Filed: Dec. 21, 2012

(86) PCT No.: PCT/KR2012/011285
§ 371 (c)(1),
(2) Date: Sep. 22, 2014

(87) PCT Pub. No.: WO2013/141469
PCT Pub. Date: Sep. 26, 2013

(65) Prior Publication Data
US 2015/0083467 A1 Mar. 26, 2015

(30) Foreign Application Priority Data
Mar. 22, 2012 (KR) .................. 10-2012-0029236

(51) Int. Cl.
*H01R 43/16* (2006.01)
*H01B 13/00* (2006.01)
(Continued)

(52) U.S. Cl.
CPC ........... *H01B 13/0036* (2013.01); *B82Y 10/00* (2013.01); *H01B 1/02* (2013.01); *H01L 29/0676* (2013.01);
(Continued)

(58) Field of Classification Search
CPC .............. B82Y 40/00; H05K 2201/026; Y10T 428/2913; Y10T 29/49117
(Continued)

(56) References Cited

U.S. PATENT DOCUMENTS 7,132,677 B2 * 11/2006 Kim ..................... H01L 33/08
257/11
7,816,700 B2 10/2010 Kim
(Continued)

FOREIGN PATENT DOCUMENTS

CN 101306794 11/2008
JP 2007059647 3/2007
(Continued)

OTHER PUBLICATIONS

International Search Report—PCT/KR2012/011285 dated Apr. 19, 2013.

*Primary Examiner* — Thiem Phan
(74) *Attorney, Agent, or Firm* — Cantor Colburn LLP

(57) ABSTRACT

Provided are a method of forming an upper electrode of a nanowire array and a nanowire array having an upper electrode formed thereon. The method includes a step of placing a polymeric thin film layer, a step of pressing, a step of treating a mixed solution, a step of etching, and a step of depositing an electrode material, such that the upper electrode is reliably formed in a state in which the polymeric thin film layer is formed on a portion of the nanowire, thereby making it possible to implement various nano-devices based on the nanowire array aligned on a substrate having a large area.

9 Claims, 9 Drawing Sheets

(51) Int. Cl.
  *B82Y 10/00*  (2011.01)
  *H01L 29/06*  (2006.01)
  *H01L 29/16*  (2006.01)
  *H01B 1/02*  (2006.01)
  *B82Y 20/00*  (2011.01)
  *B82Y 40/00*  (2011.01)
  *H01L 29/417*  (2006.01)

(52) U.S. Cl.
  CPC ............... *H01L 29/16* (2013.01); *B82Y 20/00* (2013.01); *B82Y 40/00* (2013.01); *H01L 29/417* (2013.01); *Y10T 29/49117* (2015.01)

(58) Field of Classification Search
  USPC .... 29/874, 825, 829, 846, 876, 884; 257/11, 257/13, 14, 79, 91, 98, 432
  See application file for complete search history.

(56) References Cited

U.S. PATENT DOCUMENTS 8,350,251 B1 * 1/2013 Lowgren ................ H01L 33/06
 257/13
2009/0076500 A1 3/2009 Azure

FOREIGN PATENT DOCUMENTS

| JP | 2007125687 | 5/2007 |
|---|---|---|
| JP | 2012056015 | 3/2012 |
| KR | 1020070021671 | 2/2007 |
| KR | 100791352 | 12/2007 |
| KR | 1020070119939 | 12/2007 |
| KR | 100791352 | 1/2008 |
| KR | 1020120010465 | 2/2012 |

* cited by examiner

METHOD OF FORMING UPPER ELECTRODE OF NANOWIRE ARRAY

TECHNICAL FIELD

The present invention relates to a method of forming an upper electrode of a nanowire array and a nanowire array having an upper electrode formed thereon, and more particularly, to a method of forming an upper electrode of a nanowire array and a nanowire array having an upper electrode formed thereon capable of forming the nanowire array which may be used as sensors and advanced nano-devices such as an optoelectronic device utilizing a large specific surface area of the nanowires by forming a polymeric thin film layer on top part of the nanowire array to thereby form the upper electrode on the nanowire array.

BACKGROUND ART

In the past, an one-dimensional nanowire has received attention from many researchers because of an importance of scientific researches started with distinctive electrical, physical, and chemical properties as well as applicability for various next generation nano-devices such as a high-tech electronic device, a biochemical sensor, an optoelectronic device, a future energy device, and the like. As a result, a technology capable of manufacturing various materials and forms of nanowires has been intensively explored. Particularly, a structure in which the nanowires are aligned in an array form at any angle for a surface of a substrate having a large area provides an opportunity capable of increasing an aspect ratio and a degree of integration of the nanowire, such that a specific surface area of the nanowire may be maximally utilized and efficiency of the nano-device may be increased. Therefore, an effort for manufacturing a nanowire-based device having the above-mentioned structure has been recently made.

Additionally, in order to put the nanowire-based device to practical use, physical and chemical properties of each of the nanowires aligned on the large area are effectively collected, such that proper performance of a device should be implemented. To this end, a development of a technology that all nanowires aligned on the surface of the substrate having the large area may be uniformly and stably in contact with lower and upper electrodes and may be integrated should be preceded. In addition, a technology capable of efficiently analyzing and evaluating property of the device should also be developed. However, it is difficult to grow the nanowire array having a high degree of integration in a uniform length on the large area using the related art. As well, there is also a technical limit in forming a reliable electrode on the nanowire array. For this reason, in order to manufacture a device using the nanowires so far, a method of patterning the electrode by a lithography process to thereby make contact with the nanowires dispersed in parallel on the substrate has been mainly used. In recent, a report that an electrode contact of the nanowires is formed by selectively growing the nanowire on the upper and lower electrodes in a bridge form which is pre-formed using a lithography has been proposed. However, the above-mentioned method has a complex manufacturing process and high cost as well as a limit in the degree of integration.

A method which was most widely used is a method in which only a tip portion of the nanowire is selectively exposed to thereby form a contact with a desired metal or semiconductor material by molding a polymeric insulator on the nanowire array grown on the substrate and then etching the polymer by an oxygen plasma process. However, in the above-mentioned method, since the entire nanowire surfaces are completely coated with the polymeric material, it is difficult to apply as a sensor and a high-tech nano-device such as the optoelectronic device utilizing the large specific surface area of the nanowire. In addition, in the case in which the aspect ratio of the nanowire array is increased, since the nanowires are bound with each other in the polymeric molding process and the aligned structure is destroyed, it is difficult to apply the above-mentioned processes.

Therefore, in order to put the nanowire-based device to practical use, a technology capable of economically manufacturing the extended arrays of nanowires with high aspect ratio and a technology of forming the upper and lower electrodes having excellent reliability without loss of the large specific surface area of the nanowire array need to be developed.

The related art relating thereto is disclosed in Korean Patent Laid-Open Publication No. 2012-0010465 (entitled "Method of Arranging Nanowires).

DISCLOSURE

Technical Problem

An object of the present invention is to provide a method of forming an upper electrode of a nanowire array and a nanowire array having an upper electrode formed thereon capable of implementing various nano-devices based on the nanowire array aligned on a substrate having a large area by forming the upper electrode so that a structure of the nanowire array is maintained and surfaces of the nanowires has reliability in an exposed state.

Technical Solution

In one general aspect, a method of forming an electrode on a nanowire array 10 in which a plurality of nanowires 11 are arranged on a substrate 20 having a plate shape includes: a step of placing a polymeric thin film layer (S10), heating the nanowire array 10 and placing a polymeric thin film layer 40 on the heated nanowire array 10; a step of pressing (S20) applying pressure to the polymeric thin film layer 40 placed on the nanowire array 10 in the step of placing the polymeric thin film layer (S10); a step of treating a mixed solution (S30), dipping the nanowire array 10 having the polymeric thin film layer 40 pressed thereon in the mixed solution and removing a portion of the polymeric thin film layer 40; a step of etching (S40), etching the polymeric thin film layer 40 so that a portion of the nanowires 11 passes through the polymeric thin film layer 40 and is exposed to the outside; and a step of depositing an electrode material (S50), depositing an electrode material 50 on the nanowire 11 exposed to the outside in the step of etching (S40).

The polymer thin film layer 40 may be formed to include a polymeric layer 41 and an aluminum layer 42 provided on the polymeric layer 41 and the polymeric layer 41 may be formed of thermoplastic polymer.

In the step of treating the mixed solution (S30), the mixed solution may be a mixed solution of $CuCl_2.H_2O$ and HCl, and the aluminum layer 42 of the polymer thin film layer 40 may be removed.

The method may further include, before the step of placing the polymeric thin film layer (S10), a step of vertically aligning (S60), vertically aligning the nanowires 11.

In the step of pressing (S20), the polymeric thin film layer 40 may be pressed for 10 seconds or less.

In the step of placing the polymeric thin film layer (S10), the nanowire array 10 may be heated to a temperature of a glass transition temperature that is within a range of ±10° C. of the thermoplastic polymer forming the polymeric layer 41.

In the step of etching (S40), the polymeric thin film layer 40 may be etched by an oxygen plasma apparatus.

In the step of depositing the electrode material (S50), the electrode material 50 may be gold.

In another general aspect, a nanowire array 10 having an upper electrode formed thereon is formed by the method of forming the upper electrode of the nanowire array.

Advantageous Effects

The method of forming the upper electrode of the nanowire according to the present invention may not only expand a manufacturing technology of a nanowire based device which was limited to a single nanowire to a manufacturing of a large area nanowire array based device, but also expand a property analysis of the device from the single nanowire to a bulk property analysis in a nanowire array form.

In addition, the method of forming the upper electrode of the nanowire array according to the present invention and the nanowire array having the upper electrode formed thereon by the method of forming the upper electrode of the nanowire array form a polymeric thin film layer not on the entire nanowire, but on a portion of the nanowire, they may be generally used for a wide range of nanowire based devices such as a high-tech electronic device, a thermoelectric device, a piezoelectric device, a solar cell, a sensor, an optoelectronic device, and the like because a large specific surface area may be utilized.

In addition, since the method of forming the upper electrode of the nanowire array according to the present invention excludes a lithography process requiring a lot of cost and time, it may be economical and a working time and process may be simplified, and since the polymeric thin film layer formed on the portion of the nanowire array supports the respective nanowires, the nanowire array may continuously maintain an aligned array structure even during the following processes.

In addition, since the method of forming the upper electrode of the nanowire array according to the present invention and the nanowire array having the upper electrode formed thereon by the method of forming the upper electrode of the nanowire array may prevent pollution of a surface of the nanowire due to deposition of other materials, a nanowire having a high quality may be obtained.

In addition, the method of forming the upper electrode of the nanowire array according to the present invention and the nanowire array having the upper electrode formed thereon by the method of forming the upper electrode of the nanowire array may uniformly make contact with all nanowires, such that physical and chemical properties of each of the nanowires may be simultaneously collected and efficiency of the device may also be increased.

BEST MODE

A nanowire array 10 is formed by arranging a plurality of nanowires 11 on a substrate 20 having a plate shape and further includes a metallic thin film 30 having a plurality of holes formed therein through which the nanowires 11 pass. The present invention relates to the method of forming the upper electrode of the nanowire array and the nanowire array 10 having the upper electrode formed thereon, and hereinafter, the method of forming the upper electrode of the nanowire array and the nanowire array 10 having the upper electrode formed thereon according to the embodiments of the present invention having the above-mentioned configuration will be described in detail with reference to the accompanying drawings.

Figure 1:
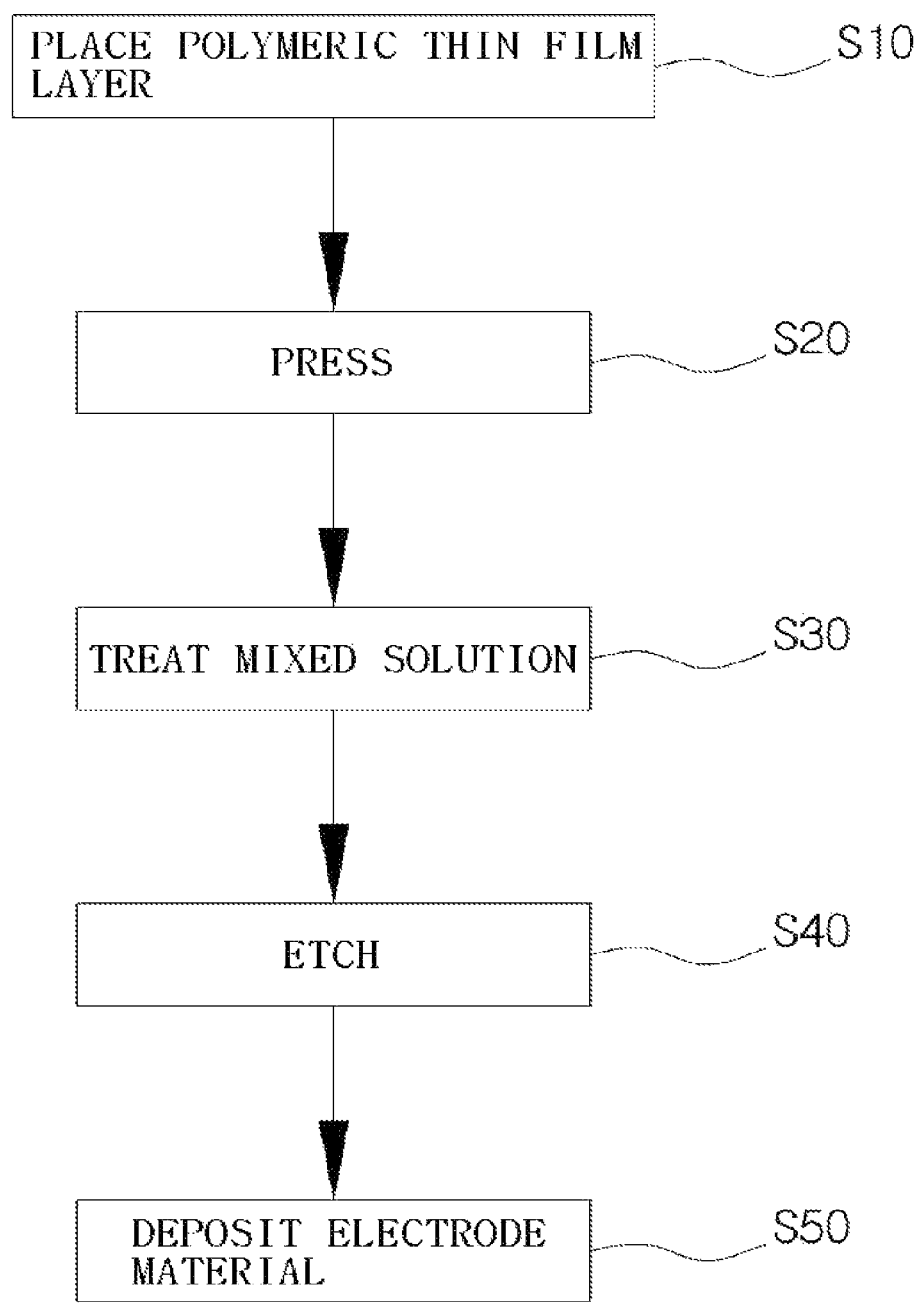
FIG. 1 is a flowchart illustrating a method of forming an upper electrode of a nanowire array according to an embodiment of the present invention.
Figure 2:
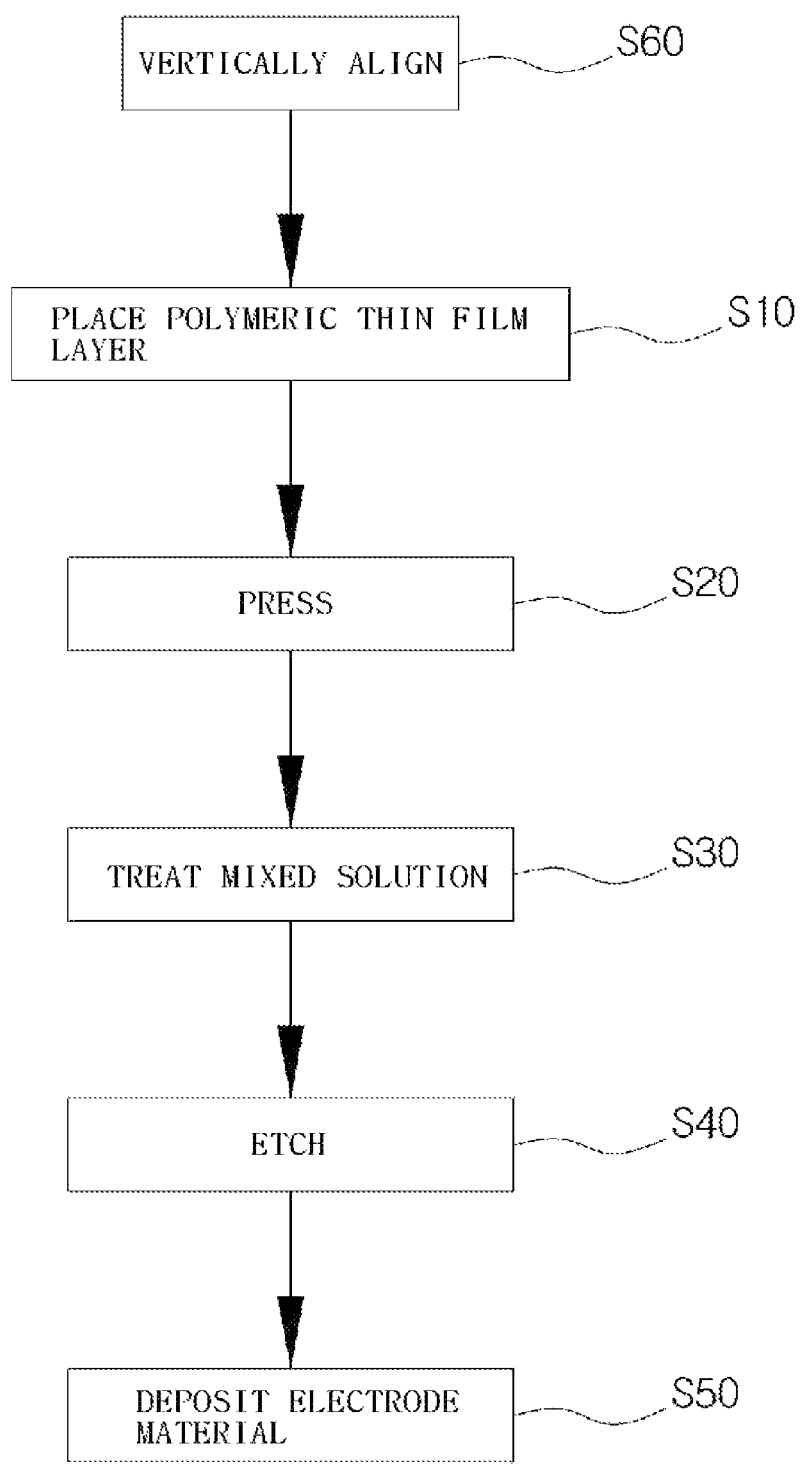
FIG. 2 is a flowchart illustrating a method of forming an upper electrode of a nanowire array according to another embodiment of the present invention.

FIG. 1 is a flowchart illustrating a method of forming an upper electrode of a nanowire array according to an embodiment of the present invention and FIG. 2 is a flowchart illustrating a method of forming an upper electrode of a nanowire array according to another embodiment of the present invention, and the method of forming the upper electrode of the nanowire array 10 according to the embodiment of the present invention will be described in detail with reference to FIGS. 1 and 2.

As illustrated in FIG. 1, the method of forming the upper electrode of the nanowire array according to the embodiment of the present invention generally includes a step of placing a polymeric thin film layer (S10), a step of pressing (S20), a step of treating a mixed solution (S30), a step of etching (S40), and a step of depositing an electrode material (S50).

Figure 3:
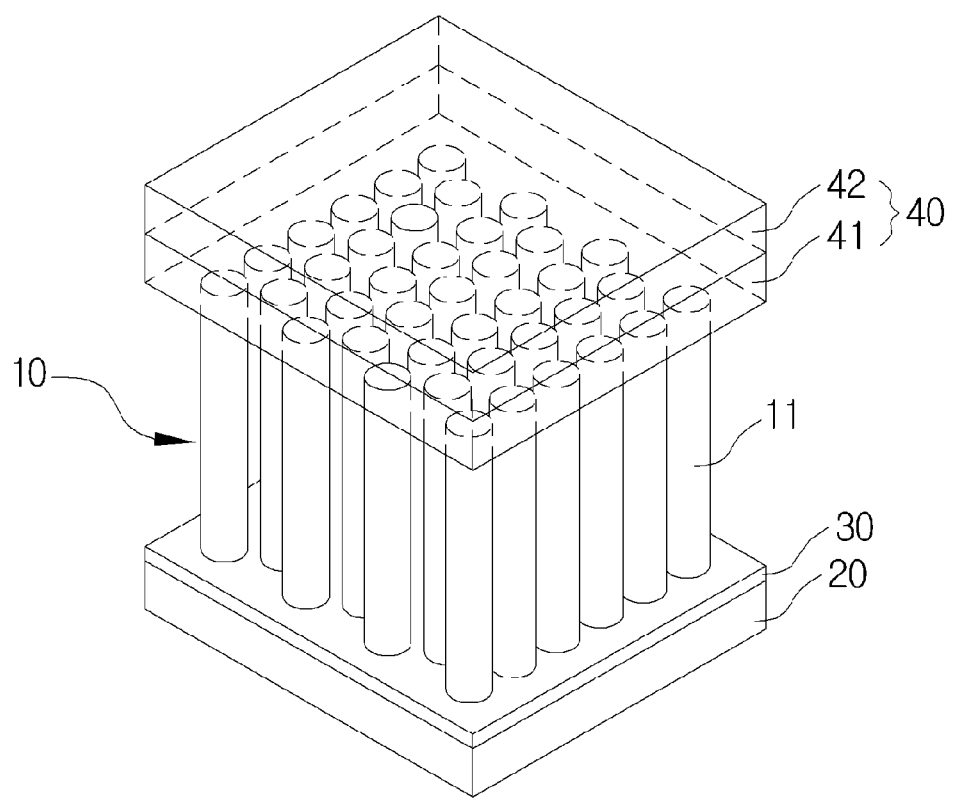
FIG. 3 is a perspective view illustrating the nanowire array in which a step of placing a polymeric thin film layer in the method of forming the upper electrode of the nanowire array according to the embodiment of the present invention is performed.

FIG. 3 is a perspective view illustrating the nanowire array in which a step of placing a polymeric thin film layer (S10) is performed, and the step of placing the polymeric thin film layer (S10) will be described in detail with reference to FIG. 3. The step of placing the polymeric thin film layer (S10) is a step of heating the nanowire array 10 and placing a polymeric thin film layer 40 on the heated nanowire array 10.

In addition, the polymeric thin film layer 40 is configured to include a polymeric layer 41 and an aluminum layer 42 formed on the polymeric layer 41. The polymeric thin film layer 40 is formed by performing a spin-coating process for an aluminum foil with a polymeric material and the polymeric material is preferably a thermoplastic polymer. That is, the polymeric layer 41 is formed of the thermoplastic polymer.

The polymeric thin film layer 40 according to the embodiment of the present invention is formed by performing the spin-coating process for the aluminum foil with polystyrene, which is the thermoplastic polymer, for 60 seconds at a rate of 5000 rpm, and is formed to have a thickness of 1.3 μm. In addition, the polymeric layer 41 may be formed of various materials without departing from an object of the present invention such as polymethyl methacrylate and the like as long as it is the thermoplastic polymer, in addition to polystyrene.

In addition, in the step of placing the polymeric thin film layer (S10), it is preferable to heat the nanowire array 10 to a temperature of a glass transition temperature that is within a range of ±10° C. of the thermoplastic polymer for forming the polymeric layer 41. The polymeric layer 41 according to the embodiment of the present invention is formed of polystyrene, and since polystyrene has the glass transition temperature of 101° C., it is most preferable to heat polystyrene to a temperature of 95° C. or more to 110° C. or less.

That is, in the case in which a temperature of the nanowire array 10 exceeds 110° C., since the polymeric thin film layer 40 may be rapidly formed up to a lower side portion of the nanowire 11, it is preferable to heat the nanowire array 10 to a temperature of 95° C. or more to 110° C. or less.

Figure 4:
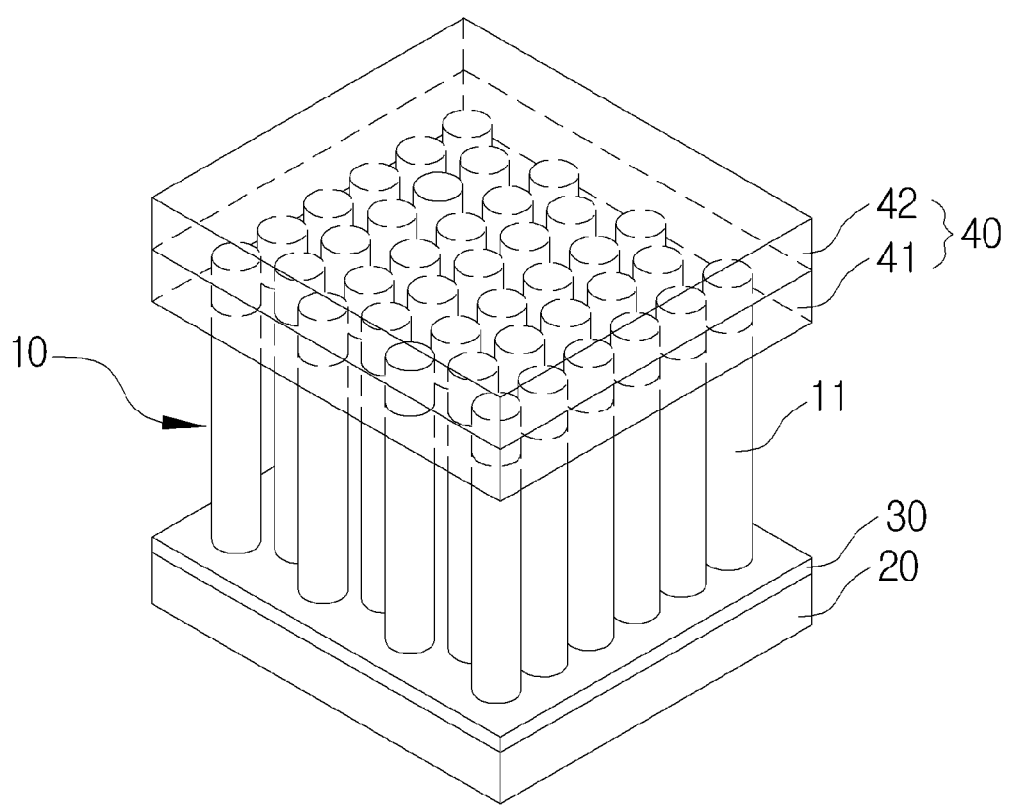
FIG. 4 is a perspective view illustrating the nanowire array in which a step of pressing in the method of forming the upper electrode of the nanowire array according to the embodiment of the present invention is performed.

FIG. 4 is a perspective view illustrating the nanowire array 10 in which the step of pressing (S20) is performed, and the step of pressing (S20) will be described with reference to FIG. 4. The step of pressing (S20) is a step of pressing the polymeric thin film layer 40 to the nanowire array 10 by applying pressure to the polymeric thin film layer 40. After the step of pressing (S20), the polymeric thin film layer 40 is partially formed on the nanowires 11.

In this case, it is preferable to apply uniform pressure to the polymeric thin film layer 40 for 10 seconds or less. In the step of pressing (S20) in the method of forming the upper electrode of the nanowire array according to the embodiment of the present invention, the uniform pressure of 10N/cm$^2$ is applied to the polymeric thin film layer 40 for 10 seconds or less, and as a result of the step of pressing (S20), the polymeric thin film layer 40 is formed at 800 nm over the nanowires 11.

Figure 5:
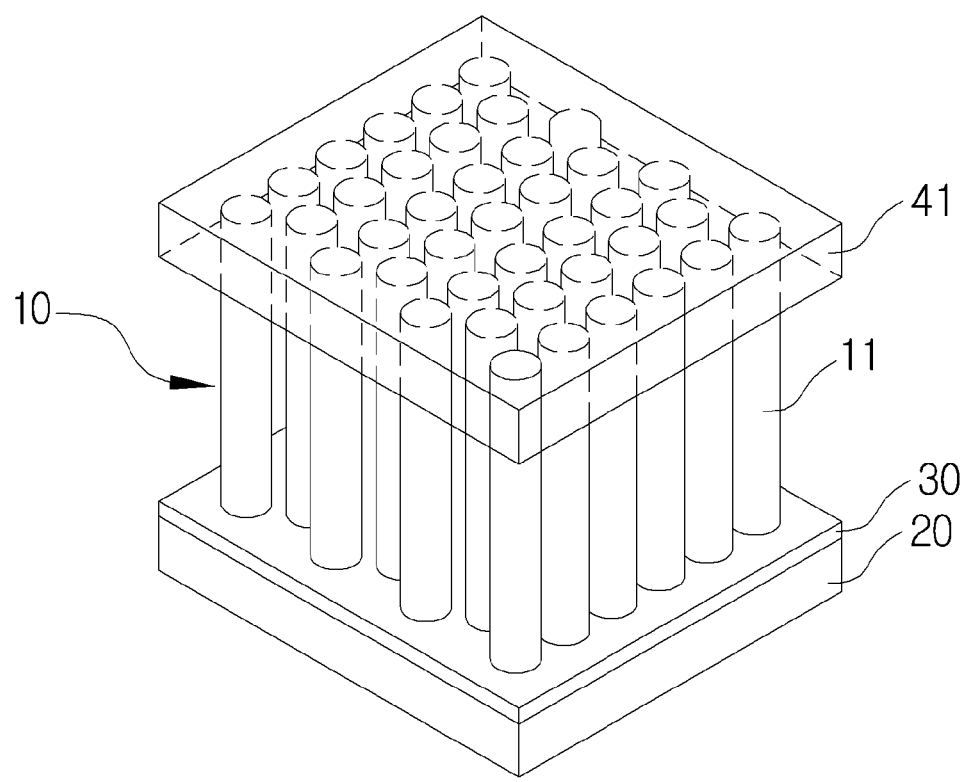
FIG. 5 is a perspective view illustrating the nanowire array in which a step of treating a mixed solution in the method of forming the upper electrode of the nanowire array according to the embodiment of the present invention is performed.

FIG. 5 is a perspective view illustrating the nanowire array 10 in which the step of treating the mixed solution (S30) is performed, and the step of treating the mixed solution (S30) will be described with reference to FIG. 5. The step of treating the mixed solution (S30) is a step of dipping the nanowire array 10 having the polymeric thin film layer 40 pressed thereon in the mixed solution and removing a portion of the polymeric thin film layer 40.

In this case, the mixed solution may be a mixed solution of $CuCl_2.H_2O$ and $HCl$, which removes an aluminum layer 42 of the polymer thin film layer 40. As illustrated in FIG. 5, after the step of treating the mixed solution (S30), the aluminum layer 42 of the polymeric thin film layer 40 is removed, and a state in which the polymeric layer 41 is partially formed on the nanowires 11 is formed.

Figure 6:
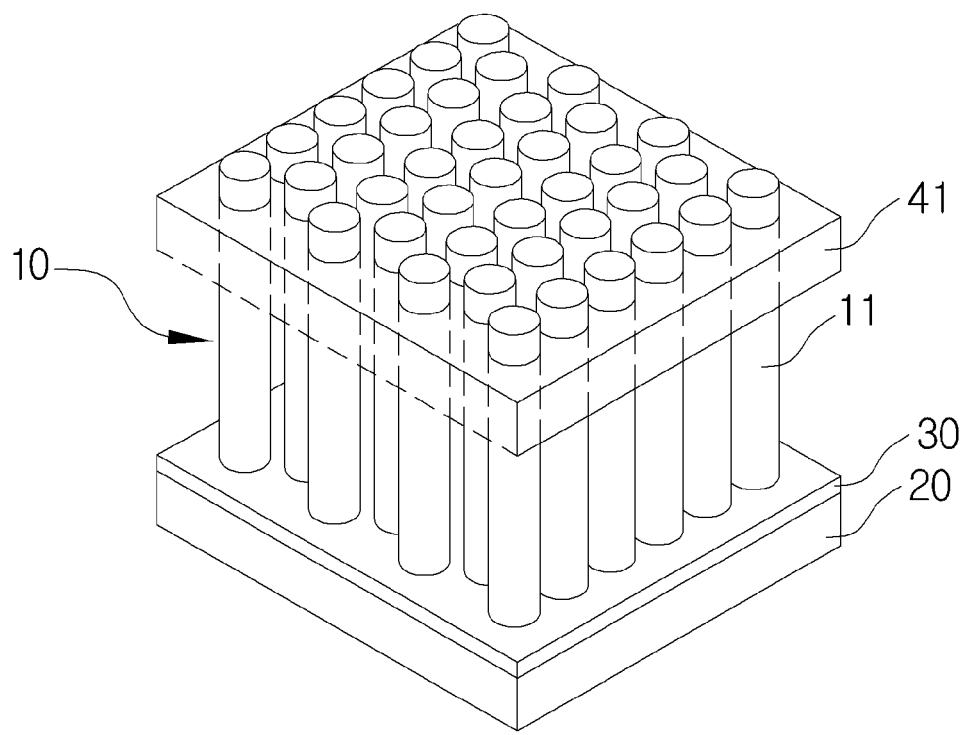
FIG. 6 is a perspective view illustrating the nanowire array in which a step of etching in the method of forming the upper electrode of the nanowire array according to the embodiment of the present invention is performed.

FIG. 6 is a perspective view illustrating the nanowire array 10 in which the step of etching (S40) is performed, and the step of etching (S40) will be described in detail with reference to FIG. 6. The step of etching (S40) is a step of etching the polymeric thin film layer 40 so that a portion of the nanowires 11 passes through the polymeric thin film layer 40 and is exposed to the outside.

In this case, the nanowires 11 may be etched by an oxygen plasma apparatus, and an apparatus of etching the nanowires 11 may be variously modified without departing from an object of the present invention, in addition to the oxygen plasma apparatus.

In the step of etching (S40) according to the embodiment of the present invention, the polymeric thin film layer 40 is etched at plasma generation power of 45 W and oxygen partial pressure of 0.15 mbar for 3 minutes by the oxygen plasma apparatus, and as a result from the step of etching (S40), it may be seen that 400 nm over the nanowires 11 is exposed.

Figure 7:
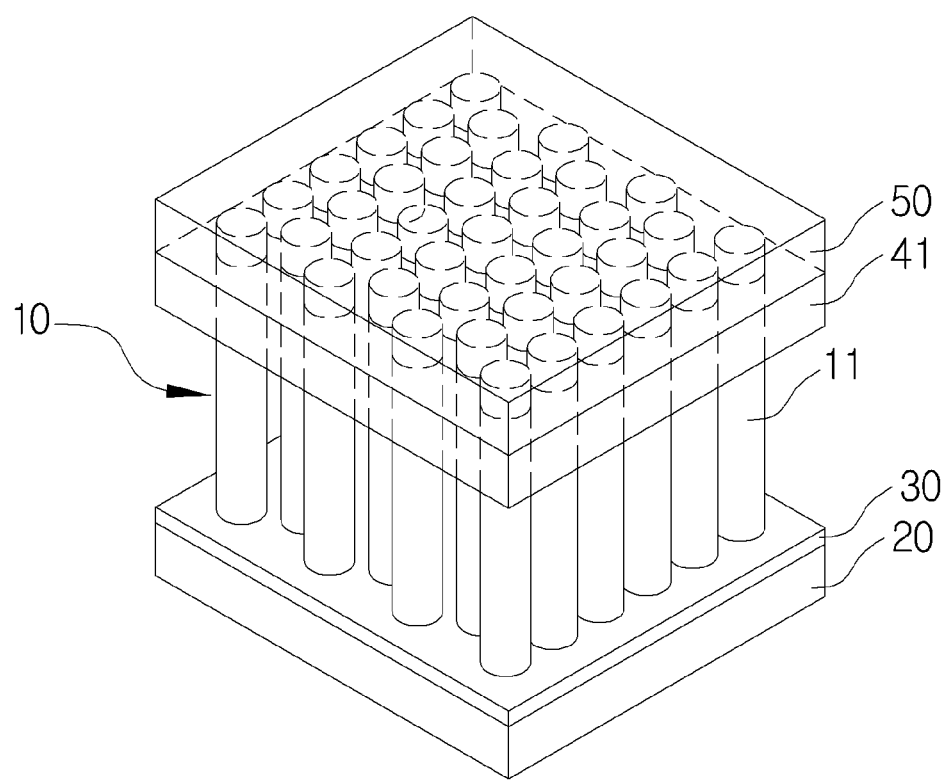
FIG. 7 is a perspective view illustrating the nanowire array having an upper electrode formed by performing a step of depositing an electrode material in the method of forming the upper electrode of the nanowire array according to the embodiment of the present invention.

FIG. 7 is a perspective view illustrating the nanowire array 10 having an upper electrode formed by performing the step of depositing the electrode material (S50), and the step of depositing the electrode material (S50) will be described with reference to FIG. 7. The step of depositing the electrode material (S50) is a step of depositing an electrode material 50 on the nanowires 11 and the nanowire 11 exposed to the outside in the step of etching (S40).

In this case, in order to allow a resistive contact to be formed between the nanowires 11 and an electrode formed by depositing the electrode material 50, the electrode material 50 may be gold and may be variously modified without departing from an object of the present invention, in addition to gold. In addition, in the step of depositing the electrode material (S50) according to the embodiment of the present invention, the upper electrode is formed of gold having a thickness of 200 nm.

In addition, the method of forming the upper electrode of the nanowire array may further include a step of vertically aligning (S60) which is performed before the step of placing the polymeric thin film layer (S10), as illustrated in the flowchart of FIG. 2. The nanowire array 10 has a vertically aligned structure which is destroyed because the nanowires 11 form a bundle due to surface tension during a dry process among manufacturing processes. Therefore, the step of vertically aligning (S60) is a step of vertically aligning the nanowires 11, in which the nanowires 11 are vertically aligned using a liquid carbon dioxide supercritical drying apparatus.

Figure 8:
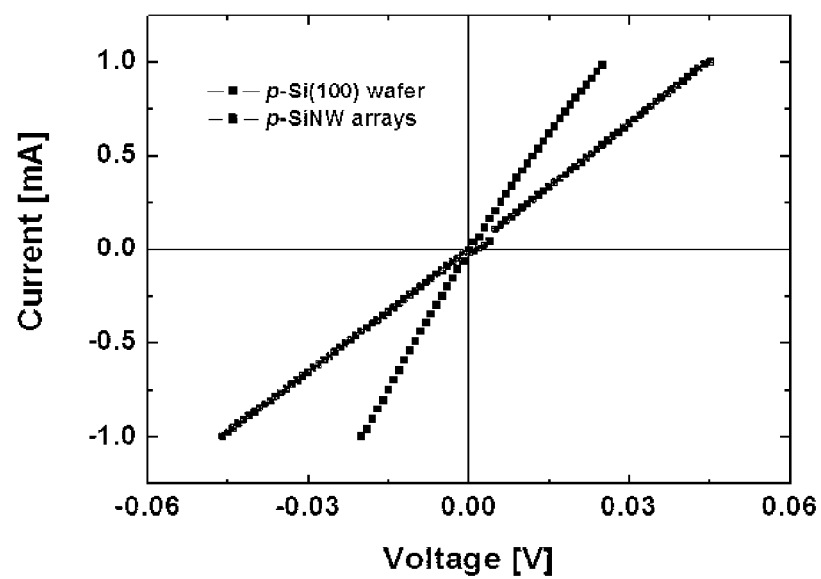
FIG. 8 is a graph illustrating results obtained by analyzing electrical property of the nanowire having the upper electrode formed by the method of forming the upper electrode of the nanowire array according to the embodiment of the present invention.
Figure 9:
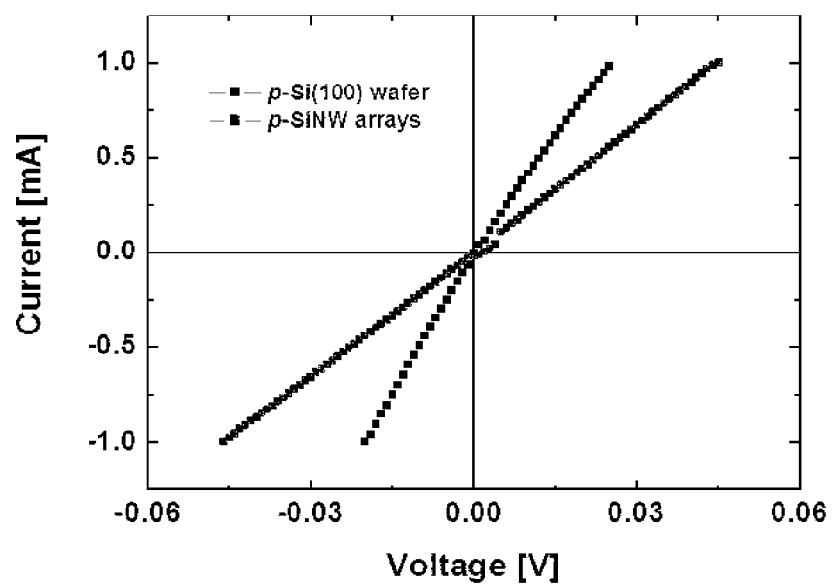
FIG. 9 is a graph illustrating results obtained by analyzing electrical property of the nanowire array having the upper electrode formed by the method of forming the upper electrode of the nanowire array according to the embodiment of the present invention.

FIG. 8 is a graph illustrating results obtained by analyzing electrical property of a single nanowire and FIG. 9 is a graph illustrating results obtained by analyzing electrical property of the nanowire array 10 having the upper electrode formed by the method of forming the upper electrode of the nanowire array according to the embodiment of the present invention. Electrical property of the nanowire array 10 having the upper electrode formed by the method of forming the upper electrode of the nanowire array according to the embodiment of the present invention will be described with reference to FIGS. 8 and 9.

FIG. 8 is a graph illustrating results obtained by patterning the electrode material (Au) by a lithography process at both ends of the single nanowire which is horizontally placed on the substrate and then analyzing electrical property thereof, and FIG. 9 is a graph illustrating results obtained by analyzing electrical property of the nanowire array 10 having the upper electrode formed by the method of forming the upper electrode of the nanowire array, wherein a semiconductor parameter analyzer (Keithley), which is generally used, is used as an analyzing equipment.

FIGS. 8 and 9 are graphs illustrating a current I depending on a voltage V, wherein FIG. 9 illustrates electrical property of a basic material substrate, which is a raw material forming the nanowire array 10 together with the graph of the nanowire array 10.

Referring to FIGS. 8 and 9, all of the nanowire 11, the nanowire array 10, and the substrate 20 show that the current is linearly increased for an applied voltage, and therefore, it may be appreciated that all three components form the resistive contact.

In addition, a resistance of the single nanowire 11 is measured to be about 15.6 Ωcm from the graph and this value indicates a value similar to a resistance of the basic material substrate itself which was used to manufacture the nanowire 11. It may be appreciated from the graph that the nanowire array 10 has also electrical conductivity similar to that of the substrate 20.

Therefore, it may be appreciated with reference to FIGS. 8 and 9 that the nanowire array 10 having the upper electrode formed by the method of forming the upper electrode of the nanowire array according to the embodiment of the present invention is aligned on a large area to effectively collect physical and chemical properties of each of the nanowires 11, thereby making it possible to implement proper performance of devices.

That is, the method of forming the upper electrode of the nanowire array and the nanowire array 10 having the upper electrode formed thereon according to the present invention may expand a manufacturing technology of a nanowire based device which was limited to the single nanowire 11 to a manufacturing of a large area nanowire array based device, which may be used for a wide range of nanowire based devices such as a high-tech electronic device, an energy device, a sensor, an optoelectronic device, and the like.

The present invention is not limited to the above-mentioned embodiments but may be variously applied, and may be variously modified by those skilled in the art to which the present invention pertains without departing from the gist of the present invention claimed in the claims.

DETAILED DESCRIPTION OF MAIN ELEMENTS

10: nanowire array  11: nanowire
20: substrate
30: metallic thin film
40: polymeric thin film layer  41: polymeric layer
42: aluminum layer
50: electrode material

The invention claimed is:

1. A method of forming an upper electrode of a nanowire array in which a plurality of nanowires are arranged on a substrate having a plate shape, the method comprising:
  a step of placing a polymeric thin film layer (S10), heating the nanowire array and placing a polymeric thin film layer on the heated nanowire array;
  a step of pressing (S20), applying pressure to the polymeric thin film layer placed on the nanowire array in the step of placing the polymeric thin film layer (S10);
  a step of treating a mixed solution (S30), dipping the nanowire array having the polymeric thin film layer pressed thereon in the mixed solution and removing a portion of the polymeric thin film layer;
  a step of etching (S40), etching the polymeric thin film layer so that a portion of the nanowires passes through the polymeric thin film layer and is exposed to the outside; and
  a step of depositing an electrode material (S50), depositing an electrode material on the nanowire exposed to the outside in the step of etching (S40).

2. The method of claim 1, wherein the polymer thin film layer is formed to include a polymeric layer and an aluminum layer provided on the polymeric layer.

3. The method of claim 2, wherein the polymeric layer is formed of thermoplastic polymer.

4. The method of claim 3, wherein in the step of placing the polymeric thin film layer (S10), the nanowire array is heated to a temperature of a glass transition temperature that is within in a range of ±10° C. of the thermoplastic polymer forming the polymeric layer.

5. The method of claim 2, wherein in the step of treating the mixed solution (S30), the mixed solution is a mixed solution of $CuCl_2.H_2O$ and HCl, and the aluminum layer of the polymer thin film layer is removed.

6. The method of claim 1, further comprising, before the step of placing the polymeric thin film layer (S10), a step of vertically aligning (S60), vertically aligning the nanowires.

7. The method of claim 1, wherein in the step of pressing (S20), the polymeric thin film layer is pressed for 10 seconds or less.

8. The method of claim 1, wherein in the step of etching (S40), the polymeric thin film layer is etched by an oxygen plasma apparatus.

9. The method of claim 1, wherein in the step of depositing the electrode material (S50), the electrode material is gold.

* * * * *